(12) United States Patent
Yamaguchi et al.

(10) Patent No.: US 8,339,800 B2
(45) Date of Patent: Dec. 25, 2012

(54) CIRCUIT MODULE

(75) Inventors: Yoshihiro Yamaguchi, Nagaokakyo (JP); Tomonori Ito, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/024,348

(22) Filed: Feb. 10, 2011

(65) Prior Publication Data

US 2011/0199744 A1 Aug. 18, 2011

(30) Foreign Application Priority Data

Feb. 12, 2010 (JP) ................................. 2010-029063

(51) Int. Cl.
*H05K 7/12* (2006.01)

(52) U.S. Cl. ........ 361/767; 361/752; 361/760; 361/800; 361/816; 361/818; 174/250; 174/256; 174/351; 257/659; 257/696; 257/723; 257/737

(58) Field of Classification Search ................ 361/767, 361/752, 760, 800, 816, 818; 174/250, 256, 174/351; 257/659, 696, 723, 737
See application file for complete search history.

(56) References Cited

U.S. PATENT DOCUMENTS

| | | | | | |
|---|---|---|---|---|---|
| 4,628,412 A | * | 12/1986 | Nigorikawa | ................ | 361/816 |
| 4,987,278 A | * | 1/1991 | Tsutsumi | ................... | 200/294 |
| 4,990,880 A | * | 2/1991 | Albert | ....................... | 336/65 |
| 5,453,017 A | * | 9/1995 | Belopolsky | ................. | 439/83 |
| 5,792,994 A | * | 8/1998 | Akahane | .................. | 174/138 G |
| 6,000,968 A | * | 12/1999 | Hagiwara | ................ | 439/607.01 |
| 6,080,016 A | * | 6/2000 | Ho et al. | ................. | 439/607.36 |
| 6,285,272 B1 | * | 9/2001 | Boytor et al. | .................. | 336/83 |
| 6,297,967 B1 | * | 10/2001 | Davidson et al. | ............ | 361/800 |
| 6,344,609 B1 | * | 2/2002 | Nakano | ..................... | 174/351 |
| 6,353,258 B1 | * | 3/2002 | Inoue et al. | ................... | 257/723 |
| 6,488,513 B1 | * | 12/2002 | Neidich et al. | ................. | 439/66 |
| 7,095,624 B2 | * | 8/2006 | Daoud et al. | ................. | 361/800 |
| 7,859,852 B2 | * | 12/2010 | Wetzel et al. | ................. | 361/749 |
| 7,924,571 B2 | * | 4/2011 | Tsubono | ...................... | 361/752 |
| 2002/0139574 A1 | * | 10/2002 | Hosaka et al. | ............... | 174/256 |
| 2003/0132885 A1 | * | 7/2003 | Kuramoto et al. | ............ | 343/702 |
| 2003/0134530 A1 | * | 7/2003 | Yu-Feng | ........................ | 439/83 |
| 2003/0203658 A1 | * | 10/2003 | Zhao et al. | ..................... | 439/63 |

(Continued)

FOREIGN PATENT DOCUMENTS

JP 2003-309397 A 10/2003

(Continued)

OTHER PUBLICATIONS

Official Communication issued in corresponding Japanese Patent Application No. 2010-029063, mailed on Jul. 3, 2012.

*Primary Examiner* — Xiaoliang Chen
(74) *Attorney, Agent, or Firm* — Keating & Bennett, LLP

(57) ABSTRACT

A circuit module includes a substrate, a component land provided on the substrate, an electronic component bonded to the component land, a case land provided on the substrate, and a case bonded to the case land so as to cover the electronic component. The case includes a top plate, and a leg that extends from a peripheral edge of the top plate in a direction substantially perpendicular to the top plate and that includes a groove in an end surface thereof that is bonded to the case land.

14 Claims, 10 Drawing Sheets

U.S. PATENT DOCUMENTS

| | | | |
|---|---|---|---|
| 2004/0017267 A1* | 1/2004 | Kane et al. | 333/116 |
| 2006/0063432 A1* | 3/2006 | Chen | 439/607 |
| 2007/0096317 A1* | 5/2007 | Kiyohara | 257/737 |
| 2007/0221399 A1* | 9/2007 | Nishizawa et al. | 174/250 |
| 2008/0068816 A1* | 3/2008 | Han et al. | 361/760 |
| 2008/0174984 A1 | 7/2008 | Miyamoto et al. | |
| 2009/0016039 A1* | 1/2009 | Imamura | 361/818 |
| 2010/0207255 A1* | 8/2010 | Fenoglio et al. | 257/659 |
| 2011/0090664 A1 | 4/2011 | Sumida et al. | |

FOREIGN PATENT DOCUMENTS

| | | |
|---|---|---|
| JP | 2008-182007 A | 8/2008 |
| JP | 2011-165685 A | 8/2011 |

* cited by examiner

30

31
33  35    32    35  34   33
32

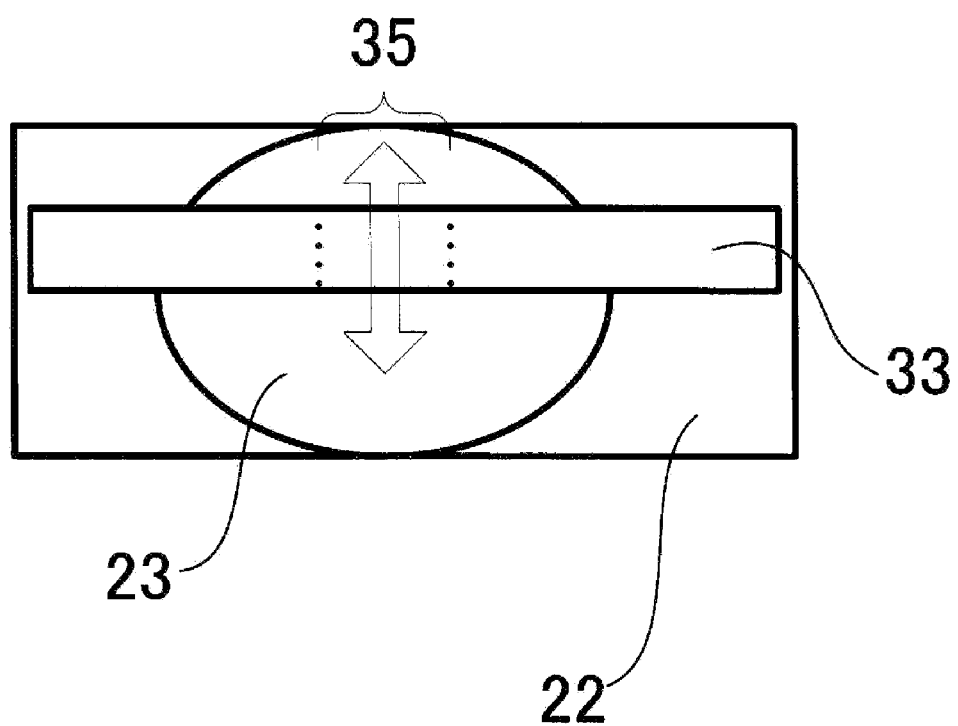

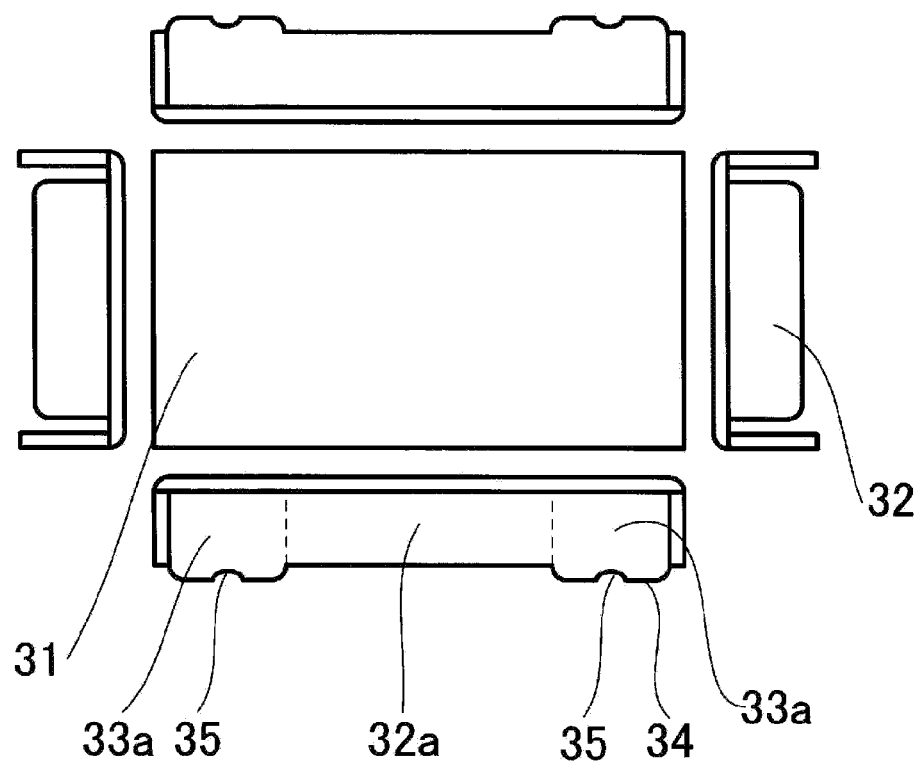

CIRCUIT MODULE

BACKGROUND OF THE INVENTION

1. Field of the Invention

The present invention relates to a circuit module. More particularly, the present invention relates to a circuit module including a case that is mounted so as to cover an electronic component mounted on a substrate.

2. Description of the Related Art

A circuit module of the related art includes a substrate, component lands provided on the substrate, an electronic component bonded to the component lands, case lands provided on the substrate, and a case bonded to the case lands so as to cover the electronic component.

In such a circuit module, the case is usually bonded to the case lands by heating and melting solder on the case lands in a reflow furnace. Therefore, when the width of the case lands is relatively large in order to provide a sufficient bonding strength of the case, the mounting position of the case is displaced. Accordingly, Japanese Unexamined Patent Application Publication No. 2004-186570 discloses a structure that attempts to prevent displacement of the mounting position of the case.

In the structure disclosed in Japanese Unexamined Patent Application Publication No. 2004-186570, as illustrated in FIG. 10, case lands 111 are provided on a substrate 110. The case lands 111 include narrow positioning portions 111a and wide bonding-strength securing portions 111b. When solder is melted by being heated in a reflow furnace, the case 112 is displaced. Japanese Unexamined Patent Application Publication No. 2004-186570 discloses that displacement of the case 112 can be prevented because the amount of displacement is dependent upon the narrow positioning portions 111a of the case lands 111.

In the above-described structure, the shape of the case lands on the substrate must be optimized in accordance with the size and shape of the case. For this reason, the design must be changed for each circuit module. Further, the amount of solder during mounting is less at the narrow portions of the case lands of the case than at the wide portions. Therefore, the bonding strength between the case and the substrate is decreased. In addition, since the area of the case lands must be increased in order to increase the bonding strength, the overall size of the circuit module is increased.

SUMMARY OF THE INVENTION

In order to overcome the problems described above, preferred embodiments of the present invention provide a circuit module in which displacement of a case during mounting is prevented.

A circuit module according to a preferred embodiment of the present invention includes a substrate, a component land provided on the substrate, an electronic component bonded to the component land, a case land provided on the substrate, and a case bonded to the case land so as to cover the electronic component. The case includes a top plate and a leg that extends from a peripheral edge of the top plate in a direction substantially perpendicular to the top plate and that includes a groove in an end surface bonded to the case land.

Preferably, the groove communicates between an inside and an outside of a space defined by the top plate and the leg.

Preferably, the groove extends substantially parallel to a thickness direction of the leg.

In a preferred embodiment of the present invention, the groove allows solder, which is melted by being heated in a reflow furnace, to flow between both sides of the end surface of the leg. For this reason, unevenness in the amount of solder on both sides of the end surface of the leg is prevented, which significantly reduces the displacement amount.

Preferably, the case includes a plurality of the legs, the top plate is substantially rectangular, and the legs are substantially plate-shaped and extend from one side of the top plate, for example.

Preferably, the case includes a plurality of the legs, the top plate is substantially rectangular, and the legs are substantially plate-shaped and extend from corresponding sides of the top plate, for example. Since the moving directions of the legs are perpendicular or substantially perpendicular to one another in the case, the displacement amount of the case is further reduced.

Preferably, the top plate is substantially rectangular, and the leg is substantially plate-shaped and obliquely intersects two sides of the top plate that define a corresponding corner of the top plate. Accordingly, the displacement amount of the case is reduced.

Preferably, the case includes a plurality of the legs, and the end surfaces of the plurality of legs have different areas and respectively include the grooves. A width of the groove provided in the leg having the end surface with a larger area is greater than a width of the groove provided in the leg having the end surface with a smaller area. In this case, the width of the groove in the smaller end surface is small, and the width of the groove in the larger end surface is large. This allows solder to more smoothly flow while preventing a reduction of bonding strength.

Preferably, the leg includes a plurality of the grooves in the end surface, for example.

Preferably, a width of the groove closer to the center of the case land is greater than a width of the groove farther from the center of the case land. In this case, since the width of the groove closer to the center of the case land at which a greater amount of solder is provided has a large width, solder flows more smoothly.

In various preferred embodiments of the present invention, the groove is preferably provided in the end surface of the leg of the case that opposes the case land and is bonded to the case land. This groove allows solder, which is melted by being heated in the reflow furnace, to flow between both sides of the end surface of the leg. For this reason, unevenness in the amount of solder on both sides of the end surface of the leg is prevented so as to reduce the displacement amount.

The above and other features, elements, characteristics and advantages of the present invention will become more apparent from the following detailed description of preferred embodiments of the present invention with reference to the attached drawings.

BRIEF DESCRIPTION OF THE DRAWINGS

FIG. 4 is an enlarged schematic view illustrating the positional relationship between a leg of the case and a case land in the circuit module of the first preferred embodiment of the present invention.

FIG. 5 is a six-surface view of a case in a circuit module according to a second preferred embodiment of the present invention.

DETAILED DESCRIPTION OF THE PREFERRED EMBODIMENTS

Preferred embodiments of the present invention will be described below with reference to the drawings.

First Preferred Embodiment

Figure 1:
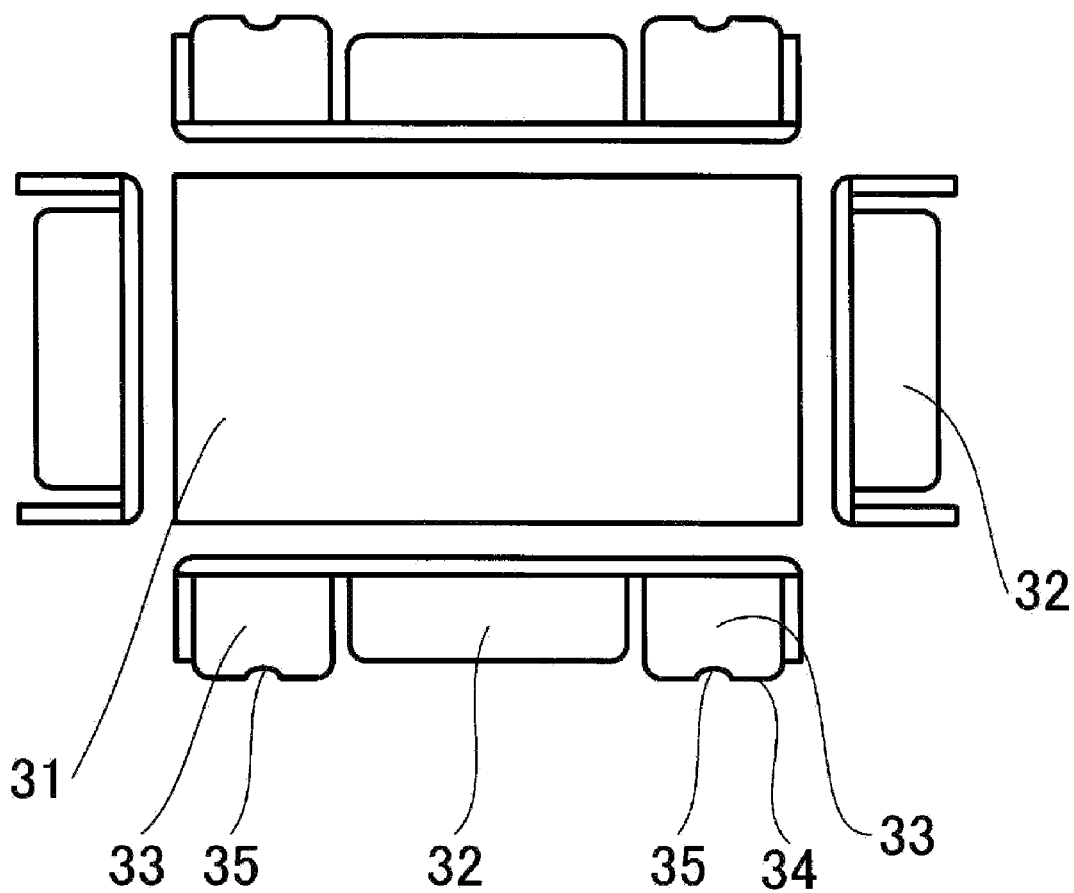
FIG. 1 is a six-surface view of a case in a circuit module according to a first preferred embodiment of the present invention.

FIG. 1 is a six-surface view of a case 30 in a circuit module according to a first preferred embodiment of the present invention. The case 30 includes a top plate 31, side plates 32, and legs 33. The side plates 32 and the legs 33 extend from a peripheral edge of the top plate 31 in a direction substantially perpendicular to the top plate 31. End surfaces 34 of the legs 33 preferably include grooves 35. For example, the case 30 is preferably made of metal or resin provided with an electrode. In the first preferred embodiment, preferably, the top plate 31 is substantially rectangular, and the legs 33 are substantially plate-shaped, for example. A plurality of legs 33 preferably extend from one side of the top plate 31.

Figure 2:
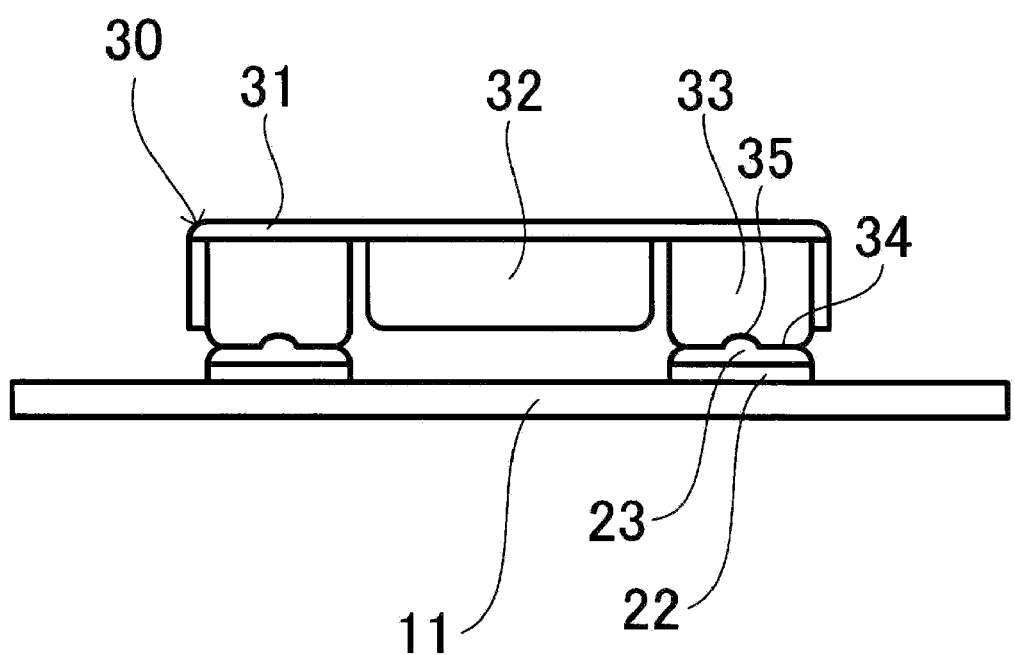
FIG. 2 is a side view of a long side surface of the case mounted in the circuit module of the first preferred embodiment of the present invention.

FIG. 2 is a side view of a long side surface of the case 30 of FIG. 1 in a mounted state. Case lands 22 are provided on a substrate 11, and the case 30 is bonded to the case lands 22. The top plate 31 of the case 30 faces a principal surface of the substrate 11, and the legs 33 extend from the peripheral edge of the top plate 31 toward the substrate 11. The end surfaces 34 of the legs 33 oppose the case lands 22. The legs 33 and the case lands 22 are bonded together by solder 23.

Figure 3A:
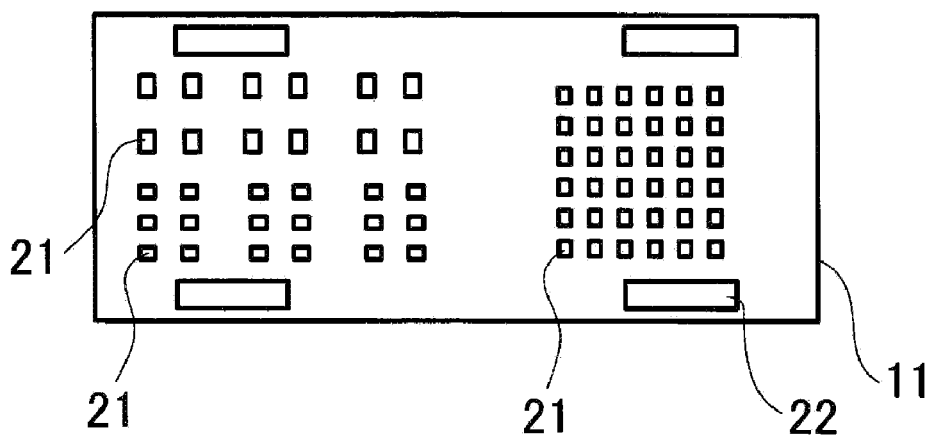
FIGS. 3A to 3C are plan views of the circuit module of the first preferred embodiment of the present invention in states before and after the case and an electronic component are mounted on a substrate.
Figure 3B:
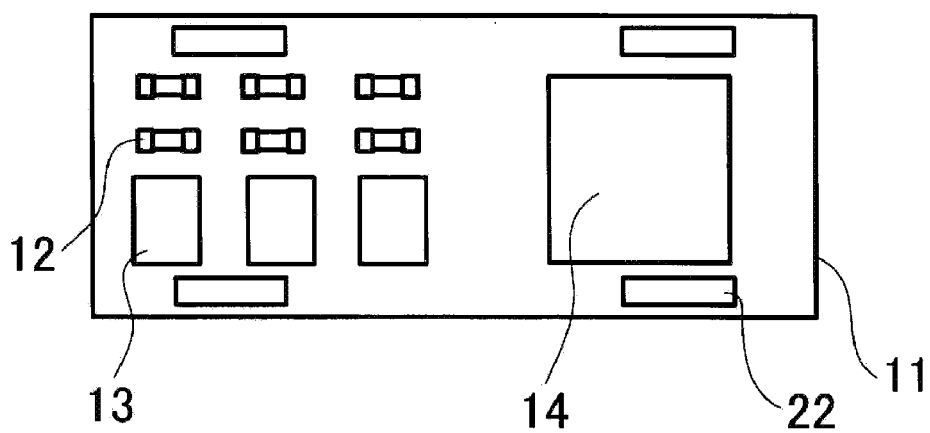
Figure 3C:
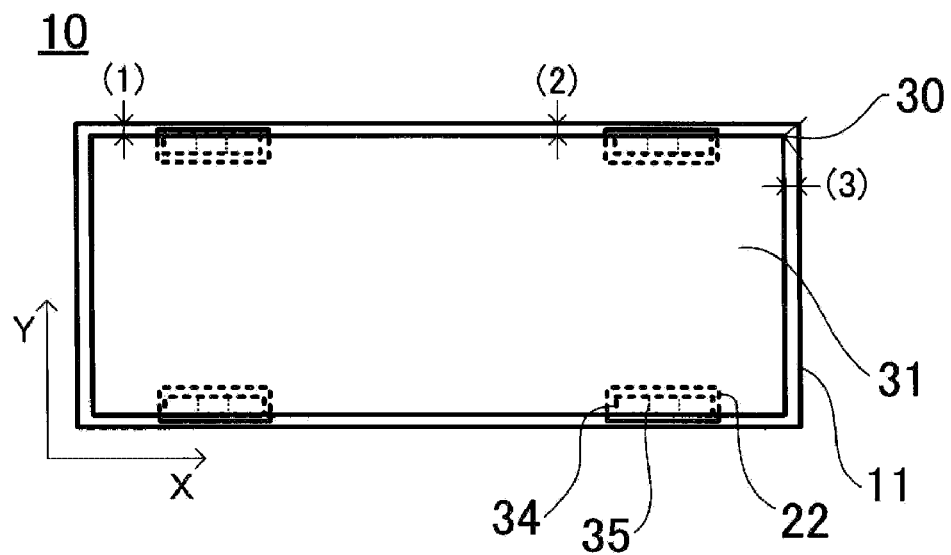

FIGS. 3A to 3C are plan views of a circuit module 10 of the first preferred embodiment in states before and after the case 30 of FIG. 1 and electronic components are mounted on the substrate 11. FIG. 3A is a plan view of the substrate 11 on which electronic components are not mounted. Component lands 21 and the case lands 22 are provided on the substrate 11.

FIG. 3B is a plan view of the substrate 11 on which the electronic components are mounted. Electronic components 12, 13, and 14 are bonded to the component lands 21 (not illustrated) provided on the substrate 11. The electronic components preferably include, for example, a capacitor, a SAW filter, and an IC.

FIG. 3C is a plan view of the circuit module 10 of the first preferred embodiment on which the case 30 is mounted. The case 30 is bonded to the case lands 22 so as to cover the electronic components. For example, after the solder 23 is supplied onto the case lands 22, the case 30 is mounted on the case lands 22 on the substrate 11 by a mounter. After that, the solder 23 is melted by being heated in a reflow furnace so as to bond the legs 33 of the case 30 to the case lands 22.

The end surfaces 34 of the legs 33 of the case 30 preferably include the grooves 35. The grooves 35 allow a space defined by the top plate 31 and the legs 33, that is, a space where the case 30 covers the electronic components to communicate with the outside of the case 30.

FIG. 4 is an enlarged schematic view illustrating the positional relationship between the legs 33 of the case 30 and the case lands 22 in FIG. 3C.

The case 30 may be displaced by the following mechanism. That is, when the legs 33 of the case 30 are mounted on the case lands 22, the amount of solder often becomes uneven on the sides of the end surfaces of the legs 33, as illustrated in FIG. 4. This is likely to result from variations in mounting positions of the legs 33 of the case 30, size variations of the case 30, variations in supply positions of the solder 23, and other factors. For this reason, it is difficult to remove the unevenness of the solder itself. If the amount of solder 23 is uneven on both sides of the end surfaces of the legs 33, the force of the solder 23 acting on the legs 33 when the solder 23 is melted in the reflow furnace is uneven, so that the legs 33 are pushed and this causes displacement.

In the first preferred embodiment, the grooves 35 of the end surfaces 34 of the legs 33 extend substantially parallel to the thickness direction of the legs 33, as illustrated in FIG. 4. For this reason, the solder 23 can more smoothly flow in the thickness direction of the legs 33 (direction of the arrow in FIG. 4) during melting. As a result, the solder 23 flows between both sides of the end surfaces of the legs 33. This reduces the force acting on the legs 33 due to melting of the solder 23, and reduces the displacement amount of the case 30.

In the first preferred embodiment, the case 30 preferably includes four legs 33 on long side surfaces, as illustrated in FIG. 3C. Since the force acts on the legs 33 of the case 30 in the Y-axis direction of FIG. 3C in this case, displacement more easily occurs in the Y-axis direction. Further, variations in mounting positions of the case 30 and variations in supply positions of the solder 23 are often caused in the same direction at the four case lands 22. For this reason, the positional relationship between the legs 33 and the solder 23 in the case lands 22 varies in the same direction among the four case lands 22. Therefore, the force acts on the four legs 33 of the case 30 in the same direction. The variations in the Y-axis direction likely increase for this reason.

Displacement of the case 30 is influenced by the dimensional accuracy during mounting, the bonding strength between the case 30 and the case lands 22, the material and weight of the case 30, the composition of the solder 23, the surface state of the substrate 11, and the area of the case lands 22. Therefore, the size of the grooves is preferably appropriately determined based on these factors.

Displacement of the case 30 after heating in the reflow furnace is influenced by the dimensional accuracy of the case 30, the positional accuracy during mounting, the material and weight of the case 30, the composition of the solder 23, the surface state of the substrate 11, and the shape of the case lands 22, for example. In contrast, the bonding strength between the case 30 and the case lands 22 after heating in the reflow furnace is influenced by the material and weight of the case 30, the composition of the solder 23, the surface state of the substrate 11, the shape of the case lands 22, and the size of the grooves 35, for example. Therefore, the size of the grooves 35 is preferably appropriately determined in consideration of these factors so as to minimize or prevent the displacement and to obtain a required bonding strength.

Second Preferred Embodiment

FIG. 5 is a six-surface view of a case 30 in a circuit module according to a second preferred embodiment of the present invention. Descriptions of portions common to the first preferred embodiment are omitted. As illustrated in FIG. 5, the case 30 includes four legs 33a provided on long side surfaces, similarly to FIG. 1. In the case 30 of FIG. 5, the legs 33a are integrally provided with side plates 32a.

Third Preferred Embodiment

Figure 6:
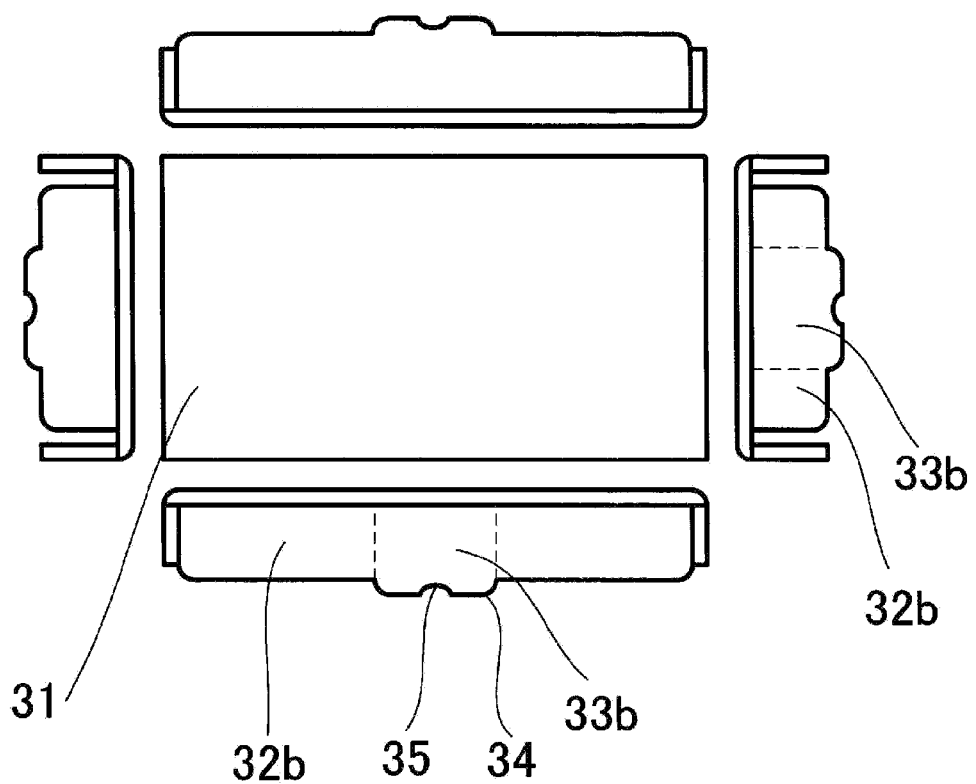
FIG. 6 is a six-surface view of a case in a circuit module according to a third preferred embodiment of the present invention.

FIG. 6 is a six-surface view of a case 30 in a circuit module according to a third preferred embodiment of the present invention. As illustrated in FIG. 6, preferably, a top plate 31 is substantially rectangular and a plurality of legs 33b are preferably substantially plate-shaped, for example. The legs 33b include grooves 35, and extend from corresponding sides of the top plate 31 in a direction substantially perpendicular to the top plate 31. In FIG. 6, the legs 33b are integrally provided with side plates 32b, in a manner similar to FIG. 5.

Fourth Preferred Embodiment

Figure 7A:
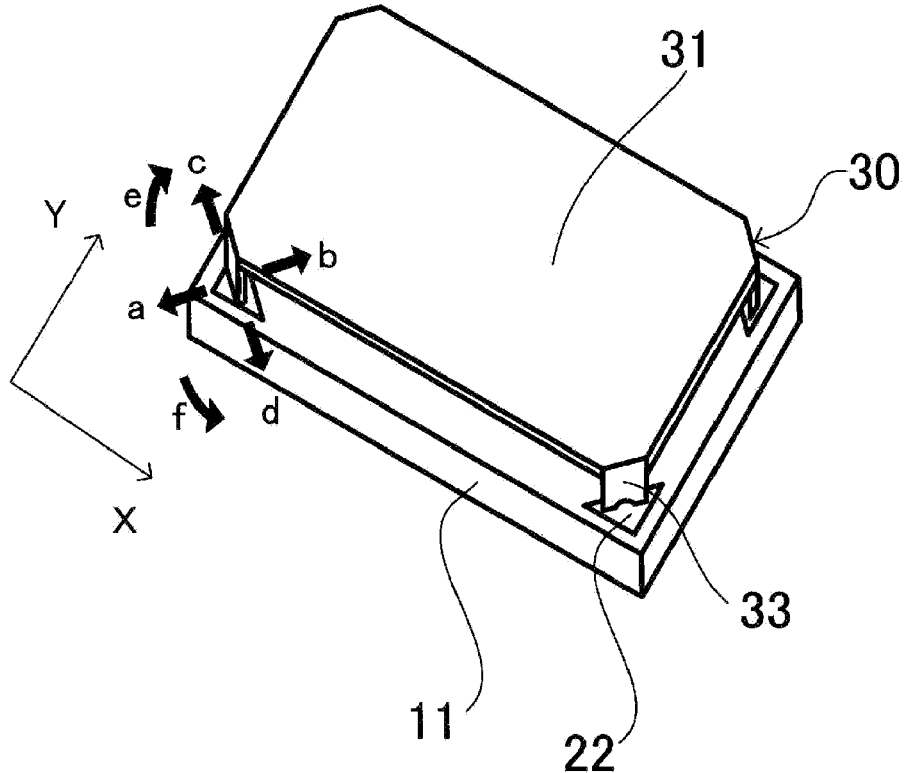
FIG. 7A is a perspective view of a circuit module according to a fourth preferred embodiment of the present invention in which a case is mounted.

FIG. 7A is a perspective view of a circuit module 10 according to a fourth preferred embodiment of the present invention in which a case 30 is mounted. As illustrated in FIG. 7A, preferably, a top plate 31 is substantially rectangular, and legs 33 are substantially plate-shaped, for example. Each of the legs 33 obliquely intersects two sides that define the corresponding corner of the top plate 31. The legs 33 of the case 30 receive forces acting in directions a, b, c, and d and forces acting in turning directions e and f.

Figure 7B:
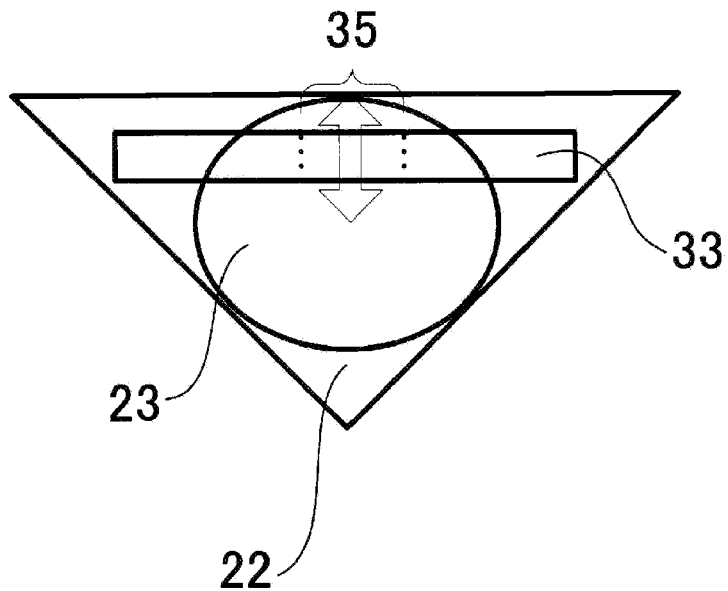
FIG. 7B is an enlarged schematic view illustrating the positional relationship between a leg of the case and a case land.

FIG. 7B is an enlarged schematic view illustrating the positional relationship between the legs 33 of the case 30 and case lands 22 of FIG. 7A. As illustrated in FIG. 7B, the case lands 22 are preferably substantially triangular. In this case, flow of solder particularly in the direction of the arrow is promoted by forming grooves 35 in end surfaces of the legs 33. As a result, it is possible to reduce the forces particularly acting in the directions a and b of FIG. 7A and to reduce the displacement amount of the legs 33. Further, by arranging the legs 33 at the positions shown in FIG. 7A, the force acting in the Y-axis direction is less than in the first preferred embodiment, and this reduces the displacement amount in the Y-axis direction. Although not illustrated, the case 30 may preferably include side plates that extend from the top plate 31 in a direction substantially perpendicular to the top plate 31.

Fifth Preferred Embodiment

Figure 8:
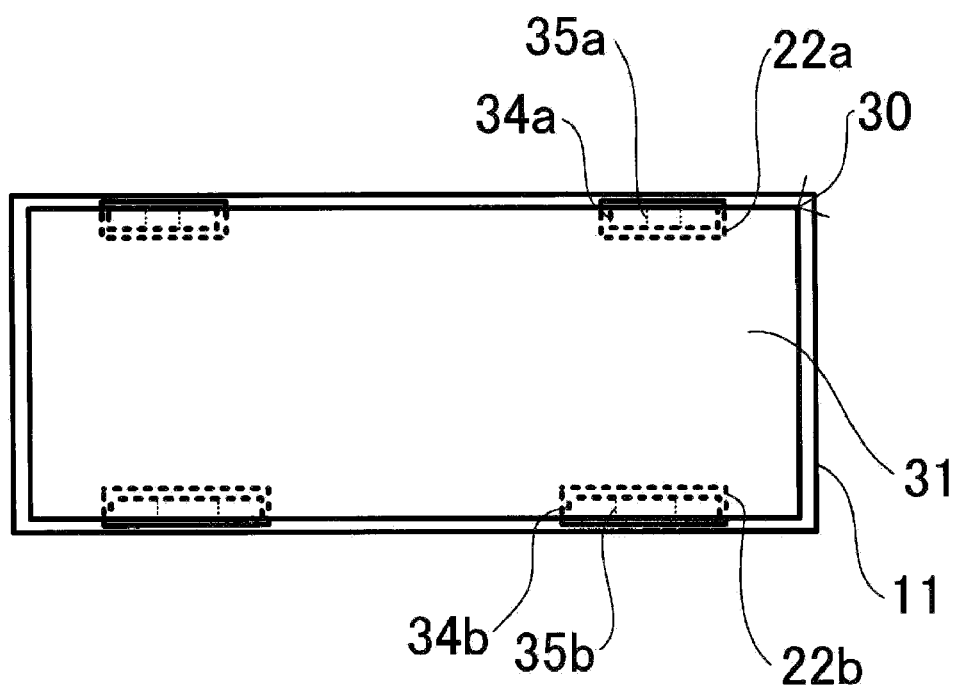
FIG. 8 is a plan view of a circuit module according to a fifth preferred embodiment of the present invention in which a case is mounted.

FIG. 8 is a plan view of a circuit module 10 according to a fifth preferred embodiment of the present invention in which a case 30 is mounted. In the fifth preferred embodiment, the case 30 preferably includes a plurality of legs including end surfaces having different areas. Referring to FIG. 8, end surfaces 34a and end surfaces 34b having different areas. The area of the end surfaces 34a is preferably smaller than that of the end surfaces 34b, for example. The legs including the end surfaces with different areas include grooves. In FIG. 8, preferably, the end surfaces 34a include grooves 35a and the end surfaces 34b include grooves 35b. In the fifth preferred embodiment, the width of the grooves 35b of the larger end surfaces 34b is preferably greater than that of the grooves 35a of the smaller end surfaces 34a.

In the fifth preferred embodiment, the width of the grooves 35a of the smaller end surfaces 34a is preferably small, and the width of the grooves 35b of the larger end surfaces 34b is preferably large. By making the width of the grooves in the smaller end surfaces small, solder can more smoothly flow while not significantly reducing the bonding strength thereof.

Sixth Preferred Embodiment

Figure 9A:
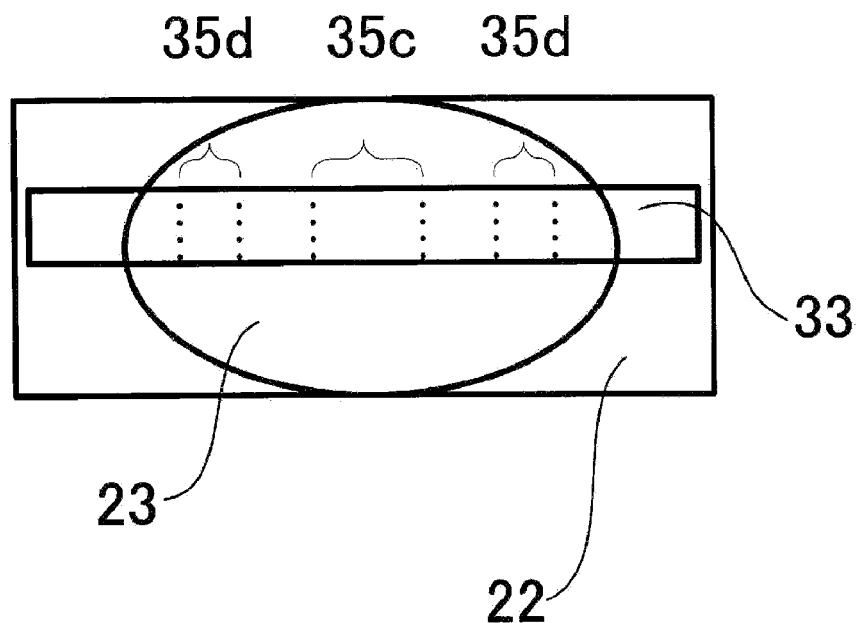
FIG. 9A is an enlarged schematic view illustrating the positional relationship between a leg of a case and a case land used in a circuit module according to a sixth preferred embodiment of the present invention.
Figure 9B:
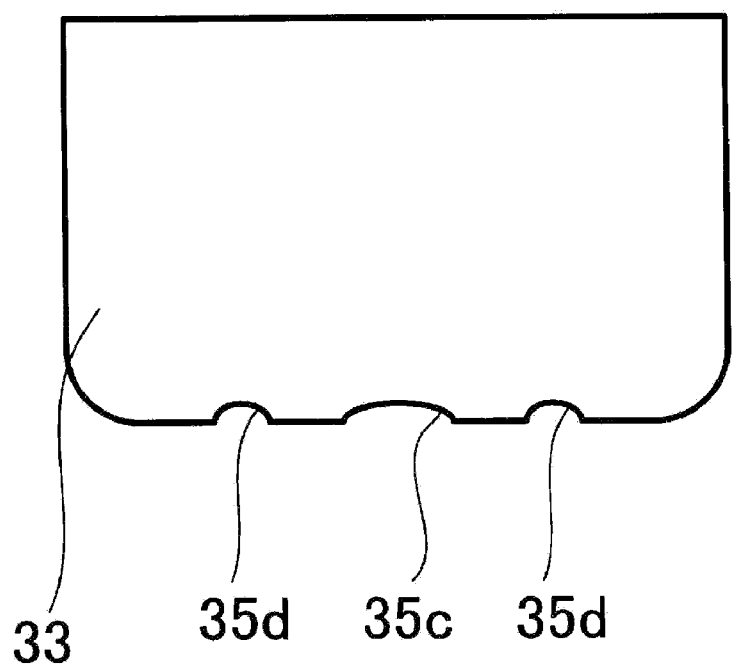
FIG. 9B is an enlarged side view of the leg.
Figure 10:
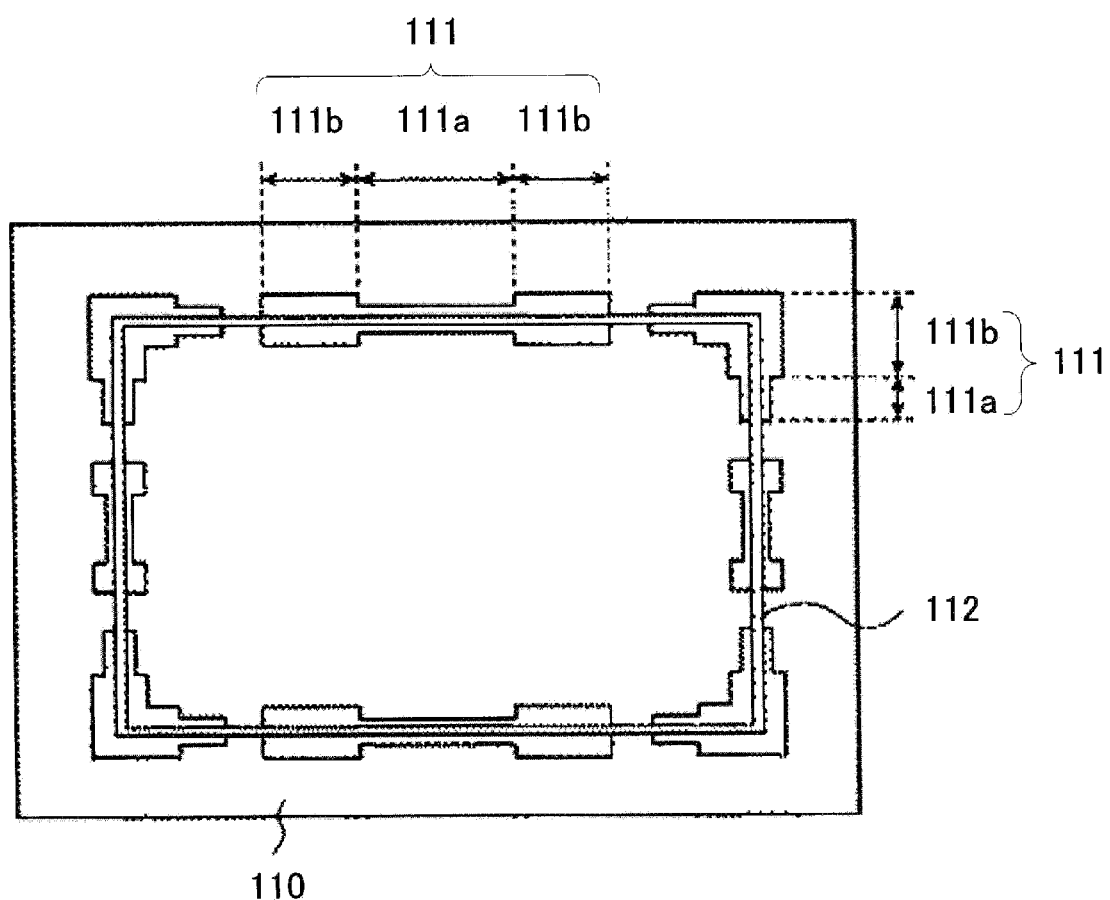
FIG. 10 is a plan view of a circuit module of the related art.

FIG. 9A is an enlarged schematic view illustrating the positional relationship between a leg 33 of a case 30 and a case land 22 in a circuit module according to a sixth preferred embodiment of the present invention. FIG. 9B is an enlarged side view of the leg 33.

In the sixth preferred embodiment, preferably, the case 30 includes legs 33 each including a plurality of grooves 35c and 35d on an end surface. The width of the groove 35c closer to the center of the corresponding case land 22 is greater than the width of the grooves 35d farther from the center of the case land 22. In this case, since the width of the groove closer to the center of the case land 22, where a large amount solder 23 is provided, is large, the solder 23 can flow more smoothly.

First Experimental Example

A circuit module in which the case of the first preferred embodiment was mounted on a substrate was produced, and displacement of the case was measured. That is, a case having a shape illustrated in the six-surface view of FIG. 1 was mounted on a substrate having a thickness of about 0.25 mm. The case had a size of about 10.9 mm×about 6.7 mm×about 0.85 mm. Case lands had a size of about 1.0 mm×about 0.4 mm. End surfaces of legs of the case had a size of about 0.92 mm×about 0.1 mm. The end surfaces of the legs were provided with grooves each having an arc having a radius of curvature of about 0.15 mm and a height of about 0.05 mm. Thirty circuit modules in each of which a case including a grooved leg was provided and thirty circuit modules in each of which a case not including a grooved leg was provided were produced. All circuit modules were measured for dimensions at three positions (1), (2), and (3) as shown in FIG. 3C so as to calculate a standard deviation of the dimensions.

Regarding the size variations in the Y-direction, that is, at the positions (1) and (2), the standard deviation of the circuit modules including the cases that included the grooved legs was reduced to about half the standard deviation of the circuit modules including the cases that included no grooved leg. In contrast, regarding the size variations in the X-direction, that is, at the position (3), the standard deviation of the circuit modules including the cases that included the grooved legs was equivalent to the standard deviation of the circuit modules including the cases that included no grooved legs. This is likely because the grooves are provided so that the solder flows in the Y-direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a substrate;
   a component land provided on the substrate;
   an electronic component bonded to the component land;
   a case land provided on the substrate; and
   a case bonded to the case land and arranged so as to cover the electronic component; wherein
   the case includes a top plate, and a plurality of legs that extend from a peripheral edge of the top plate in a direction substantially perpendicular to the top plate and each of the plurality of legs includes a groove in an end surface thereof that is bonded to the case land;
   the case land is substantially planar and includes a main surface that is substantially parallel to a main surface of the substrate;
   the end surface of the plurality of legs have different areas; and
   a width of the groove provided in a first leg of the plurality of the legs including the end surface with a larger area is greater than a width of the groove provided in a second leg of the plurality of legs including the end surface with a smaller area.

2. The circuit module according to claim 1, wherein each of the grooves is arranged to communicate between an inside and an outside of a space defined by the top plate and a respective leg of the plurality of legs.

3. The circuit module according to claim 2, wherein each of the grooves extends substantially parallel to a thickness direction of the respective leg of the plurality of legs.

4. The circuit module according to claim 1, wherein the top plate is substantially rectangular, and the plurality of the legs are substantially plate-shaped and extend from one side of the top plate.

5. The circuit module according to claim 1, wherein the top plate is substantially rectangular, and the plurality of the legs are substantially plate-shaped and extend from corresponding sides of the top plate.

6. The circuit module according to claim 1, wherein the top plate is substantially rectangular, and the plurality of legs are substantially plate-shaped and obliquely intersect two sides of the top plate that define a corresponding corner of the top plate.

7. The circuit module according to claim 1, wherein each of the plurality of legs includes a plurality of the grooves in the end surface thereof.

8. The circuit module according to claim 7, wherein a width of a groove of the plurality of the grooves arranged closer to a center of the case land is greater than a width of a groove of the plurality of the grooves arranged farther from the center of the case land.

9. A circuit module comprising:
   a substrate;
   a component land provided on the substrate;
   an electronic component bonded to the component land;
   a case land provided on the substrate; and
   a case bonded to the case land and arranged so as to cover the electronic component; wherein
   the case includes a top plate, and a leg that extends from a peripheral edge of the top plate in a direction substantially perpendicular to the top plate and that includes a groove in an end surface thereof that is bonded to the case land;
   the case land is substantially planar and includes a main surface that is substantially parallel to a main surface of the substrate;
   the leg includes a plurality of the grooves in the end surface thereof; and
   a width of a groove of the plurality of the grooves arranged closer to a center of the case land is greater than a width of a groove of the plurality of the grooves arranged farther from the center of the case land.

10. The circuit module according to claim 9, wherein each of the plurality of grooves is arranged to communicate between an inside and an outside of a space defined by the top plate and the leg.

11. The circuit module according to claim 10, wherein each of the plurality of grooves extends substantially parallel to a thickness direction of the leg.

12. The circuit module according to claim 9, wherein the case includes a plurality of the legs, the top plate is substantially rectangular, and the plurality of the legs are substantially plate-shaped and extend from one side of the top plate.

13. The circuit module according to claim 9, wherein the case includes a plurality of the legs, the top plate is substantially rectangular, and the plurality of the legs are substantially plate-shaped and extend from corresponding sides of the top plate.

14. The circuit module according to claim 9, wherein the top plate is substantially rectangular, and the leg is substantially plate-shaped and obliquely intersects two sides of the top plate that define a corresponding corner of the top plate.

* * * * *